United States Patent [19]
Chung et al.

[11] Patent Number: 6,044,020
[45] Date of Patent: Mar. 28, 2000

[54] NONVOLATILE SEMICONDUCTOR MEMORY DEVICE WITH A ROW DECODER CIRCUIT

[75] Inventors: Hwi-Taek Chung; Seoung-Keun Lee, both of Kyunggi-do, Rep. of Korea

[73] Assignee: Samsung Electronics Co., Ltd., Kyungki-do, Rep. of Korea

[21] Appl. No.: 09/123,795

[22] Filed: Jul. 28, 1998

[51] Int. Cl.[7] .................................................. G11C 16/06
[52] U.S. Cl. ................................. 365/185.23; 365/185.11
[58] Field of Search .......................... 365/185.11, 185.18, 365/185.19, 185.23, 185.28, 185.29

[56] References Cited

U.S. PATENT DOCUMENTS 5,619,450  4/1997  Takeguchi ........................... 365/185.23

*Primary Examiner*—David Nelms
*Assistant Examiner*—Anh Phung
*Attorney, Agent, or Firm*—F. Chau & Associates, LLP

[57] ABSTRACT

A nonvolatile semiconductor memory device which comprises a memory cell array having a plurality of memory blocks each divided into a plurality of segments, each of which has a plurality of word lines, a plurality of bit lines arranged to intersect the word lines, and a plurality of memory cells connected to the word lines and the bit lines. The device has means for decoding segment select signals to generate a decode signal that selects one of the segments, and means connected to a first power node, for receiving word line select signals to select one of the word lines in the selected segment to output a first voltage applied to the first power node. In the nonvolatile semiconductor memory device, furthermore, a word line driver, which is connected to a second power node, applies the first voltage to the selected word line during read, write, and test modes of operation, and applies a second voltage supplied to the second power node to the selected word line during an erase mode of operation, in response to the decoded signal from the decoding means.

20 Claims, 6 Drawing Sheets

NONVOLATILE SEMICONDUCTOR MEMORY DEVICE WITH A ROW DECODER CIRCUIT

FIELD OF THE INVENTION

The present invention relates to electrically erasable and programmable read-only memory (EEPROM), and more particularly to a row decoder circuit in the EEPROM.

BACKGROUND OF THE INVENTION

Memory circuits are well known, and include an array of memory cells, each capable of storing a bit of information. In order to appropriately access a desired word of information, comprising a plurality of bits, appropriate row decoder circuits are used which select appropriate row lines (or word lines) for access. Similarly, column accessing circuitry is often employed to select an appropriate number of bits within the row for output.

FIG. 1 is a block diagram of a typical flash memory device 100 including a memory cell array 120 having a plurality of memory cells such as flash EEPROM cells, which have the same structure as depicted in FIG. 2 to be described below. The memory cell array 120 is divided into a plurality of sectors (or blocks) 125 each of which is a basic erase unit. Each of the sectors 125 is composed of a plurality of segments 126 having a plurality of word lines (for example, eight word lines), a plurality of bit lines arranged so as to intersect the word lines, and a plurality of memory cells connected to the word lines and the bit lines. A address circuit 160 applies row information to a row decoder circuit 140 defining which of the word lines (or rows) of the memory cell array 120 is to be selected for reading or writing. The row decoder circuit 140 is composed of a plurality of segment decoders 151, each of which corresponds to the segments, respectively. Each of the segments 126 in a selected sector 125 (or block) will be selected by the corresponding segment decoder 151 in accordance with a segment select information, one of the word lines in the selected segment 126 will be selected thereby in accordance with a word line select information. Similarly, a column decoder circuit 180 receives address information defining which one or ones of the bit lines (or columns) of the memory cell array 120 are to be selected. Data read from or to be applied to the memory cell array 120 is stored in data buffer circuit 200.

Referring to FIG. 2, there is illustrated a block configuration diagram of the segment decoder 151 in FIG. 1. The segment decoder 151 is composed of a segment selector 141 and a plurality of word line drivers 150 connected to corresponding word lines WL1 to WLn in a segment 126, respectively. When one segment is selected by the segment selector 141 and one of word line select signals S1 to Sn is enabled, one of the word lines WL1 to WLn in the selected segment is selected and driven by corresponding word line driver 150 receiving the enabled word line select signal.

FIG. 3 shows a part of memory cell array 120 in FIG. 1 and a detailed circuit diagram of a segment selector 141 and a word line driver 150. For the sake of simplicity, the row decoder 140 according to the prior art shown in FIG. 2 will be discussed in connection with one word line, and it is to be understood that like circuits are coupled to each word line. In FIG. 3, memory cells 121, which can be flash EEPROM cells (or referred to as ETOX-type cells) are arranged in matrix form. Word lines 122 are commonly connected to gates (or control gates) of the memory cells 121 arranged in the same row of the memory cell array 120. Bit lines 123 are arranged so as to intersect the word lines 122 and commonly connected to drain regions of the memory cells 121 arranged in the same column of the memory cell array 120.

In the memory cell array 120, during the read mode of operation, a voltage (for example, 4.5V) is applied to a selected word line 122, and an intermediate voltage (for example, 1V) is applied to a selected bit line 123. During a write (or programming) mode of operation, a high voltage (for example, 10V) is applied to the selected word line 122, and a high voltage (for example, 5V) is also applied to the selected bit line 123. During an erase mode of operation, the bit lines 123 and the source lines 124 all become a floating state, and a negative voltage (for example, -10V) is also applied to all the word lines 122.

As illustrated in FIG. 3, the segment selector 141 comprises an NAND gate G1 and an NMOS transistor 142. The NAND gate G1 receives and decodes segment select signals Pi and Qi. The NMOS transistor 142 is connected to the output of the NAND gate G1 and a word line driver 150, and has its gate connected to a Shut-Off voltage. The word line driver 150 is connected to a first power node 151, a second power node 152, and a corresponding word line 122, and applies a first voltage VPX supplied to the first power node 151 to the word line 122 during the read and write modes of operation in response to a corresponding word line select signal Si. The word line driver 150 applies a second voltage VEX supplied to the second power node 152 to the word line 122 during the erase mode of operation in response to the word line select signal Si.

The word line driver 150 is comprised of two NMOS transistors 143 and 147 and three PMOS transistors 144, 145 and 146. The NMOS transistor 143 whose gate is connected to the word line select signal Si line 148 has a current path formed between a node ND and the segment selector 141. The PMOS transistor 144 whose current path is formed between the first power node 151 and the node ND has its gate connected to the word line select signal Si line 148. The PMOS transistor 145 whose gate is connected to the word line 122 has its current path formed between the node VPX and ND. The PMOS transistor 146 has its gate connected to the node ND and its current path formed between the first power node 151 and the word line 122. A gate of the NMOS transistor 147, connected to the node ND, has a current path formed between the word line 122 (that is, the PMOS transistor 146) and the second power node 152. The transistors 146 and 147 serve as a CMOS inverter circuit (or pull-up and pull-down transistors).

The first power node 151 is provided as the first voltage VPX with a voltage of approximately 4.5V and a voltage of about 10V during the read and programming modes of i operation, respectively. The second power node 152 receives a ground voltage 0V during the read and programming modes of operation, and receives a voltage of approximately -10V during an erase mode of operation. Thus, the word line driver 150 acts as a voltage level shifter of a shift-up type for transferring the several voltages into the word line 122.

The operation of the memory cell array 120 of FIG. 3 will be explained. Assuming that one of the sectors 125 of the memory cell array 120 is selected for the sake of simplicity, it is readily apparent to those skilled in the art that other sectors 125 can be operated by the same manner as described below.

During the read mode of operation, segment select signals Pi and Qi applied into the NAND gate G1 corresponding to a segment to be selected are at high level (for example, a power supply voltage), and the word line select signal Si corresponding to a word line to be selected in the selected segment is at the high level, a first and second voltages VPX and VEX are 4.5V and 0V, respectively. At this time, outputs of the respective NAND gates G1 in segment selectors 141 corresponding to unselected segments 126 are at the high level, word line select signals Si corresponding to unselected word lines in the selected segment 126 and unselected segments 126 are at the low level, and the first voltage VPX of 4.5V and the second voltage VEX of 0V are commonly applied to the unselected segments 126. Under this condition, the transistors 143 and 146 in the word line driver 150 corresponding to the selected word line 122 will be conductive, enabling the selected word line 122 to be pulled up to the first voltage VPX of 4.5V through the turned-on PMOS transistor 146. On the contrary, the unselected word lines associated with the selected segment 126 and the unselected segments 126 are at the second voltage VEX of 0V because the transistors 143 and 146 therein will be non-conductive and the transistors 144,145 and 146 therein will be conductive.

During the write mode of operation, the output of the NAND gate G1 corresponding to the selected segments 126 is at the low level, the word line select signal Si corresponding to the selected word line 122 is at the high level, and the first and second voltage VPX and VEX are 10V and 0V, respectively. At the same time, the outputs of the respective NAND gates G1 corresponding to the unselected segments 126 are at the high level, the word line select signals Si corresponding to the unselected word lines 122 are at the low level, and the first voltage VPX of 10V and the second voltage VEX of 0V are commonly applied to the unselected segments.

According to this bias condition, the transistors 143 and 146 in the word line driver 150 corresponding to the selected word line 122 will be conductive, enabling the selected word line 122 to be pull up to the first voltage VPX of 10V through the turned-on PMOS transistor 146. On the contrary, the unselected word lines are at the second voltage VEX of 0V because the transistors 143 and 146 therein will be non-conductive and the transistor 144, 145, and 146 therein will be conductive.

During the erase mode of operation, outputs of the NAND gates G1 corresponding to all the segments 126 (that is, in one sector 125 being an erase unit) are at low level, word line select signals Si respectively corresponding to the word lines in each segment 126 are at high level, and the first voltage VPX and the second voltage VEX are 0V and −10V, respectively.

Note that the Shut-off voltage is 0 V during the erase mode of operation. Under this bias condition, the transistors 144 and 147 will be conductive, causing all the word lines 122 of the selected sector 125 to be pull down to the second voltage VEX of approximately −10V. At this time, the transistors 144, 145, and 146 will be turned off.

A test mode operation is commonly performed for detecting each threshold voltage distribution of flash EEPROM cells in the memory cell array 120. During the test mode of operation, in order to detect a memory cell state, a voltage on a selected word line may be changed sequentially from the lowest voltage level (for example, 1V indicating an over-erase verification level) to the highest voltage level (for example, 6V indicating a programming verification level). The operation of the word line driver 150 in FIG. 3 during the test mode of operation differs from that of the read mode of operation only in that the first voltage VPX is changed instead of being maintained at a fixed voltage during the test mode of operation. In the row decoder 140 (FIG. 1) according to the above-mentioned prior art, there is a problem to be described below when the test mode of operation is performed.

In the word line drivers 150 associated with both an unselected segment and the word line select signal Si being at the low level during the test mode of operation, the node ND thereof is at the high level (for example, 4V), the word line select signal Si is at low level (for example, 0V), and the second voltage VEX is 0V. According to this bias condition, if the first voltage VPX is varied from 1V to 4V, the first power node 151 and the node ND are momentarily shorted electrically through the PMOS transistor 144. That is, as shown in FIG. 4, a forward bias condition is formed between the node ND and the bulk of the PMOS transistor 144, and also the PMOS transistor 144 is somewhat conductive. This raises the first voltage VPX while the test operation is being performed. Therefore, it is impossible to perform a test operation by use of the row decoder circuit 140 when the first voltage VPX is less than the high level of the power supply voltage.

SUMMARY OF THE INVENTION

It is therefore an object of the present invention to provide a nonvolatile semiconductor memory device with a row decoder circuit capable of supplying various voltages useful in read, write, erase, and test modes of operation.

It is another object of the invention to provide a nonvolatile semiconductor memory device having a row decoder circuit with an improved integration degree.

According to an aspect of the present invention, an electrically erasable and programmable nonvolatile semiconductor memory device is provided. The electrically erasable programmable nonvolatile semiconductor memory device comprises a memory cell array having a plurality of memory blocks each divided into a plurality of segments, wherein each of the segments has a plurality of word lines, a plurality of bit lines arranged to intersect the word lines, and a plurality of memory cells connected to the word lines and the bit lines; means for decoding segment select signals to generate a decode signal that selects one of the segments; means connected to a first power node, for receiving word line select signals to select one of the word lines in the selected segment to output a first voltage applied to the first power node; and means connected to a second power node, for applying the first voltage to the selected word line during read, write, and test modes of operation, and for applying a second voltage supplied to the second power node to the selected word line during an erase mode of operation, in response to the decoded signal from the decoding means.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF PREFERRED EMBODIMENTS

Figure 2:
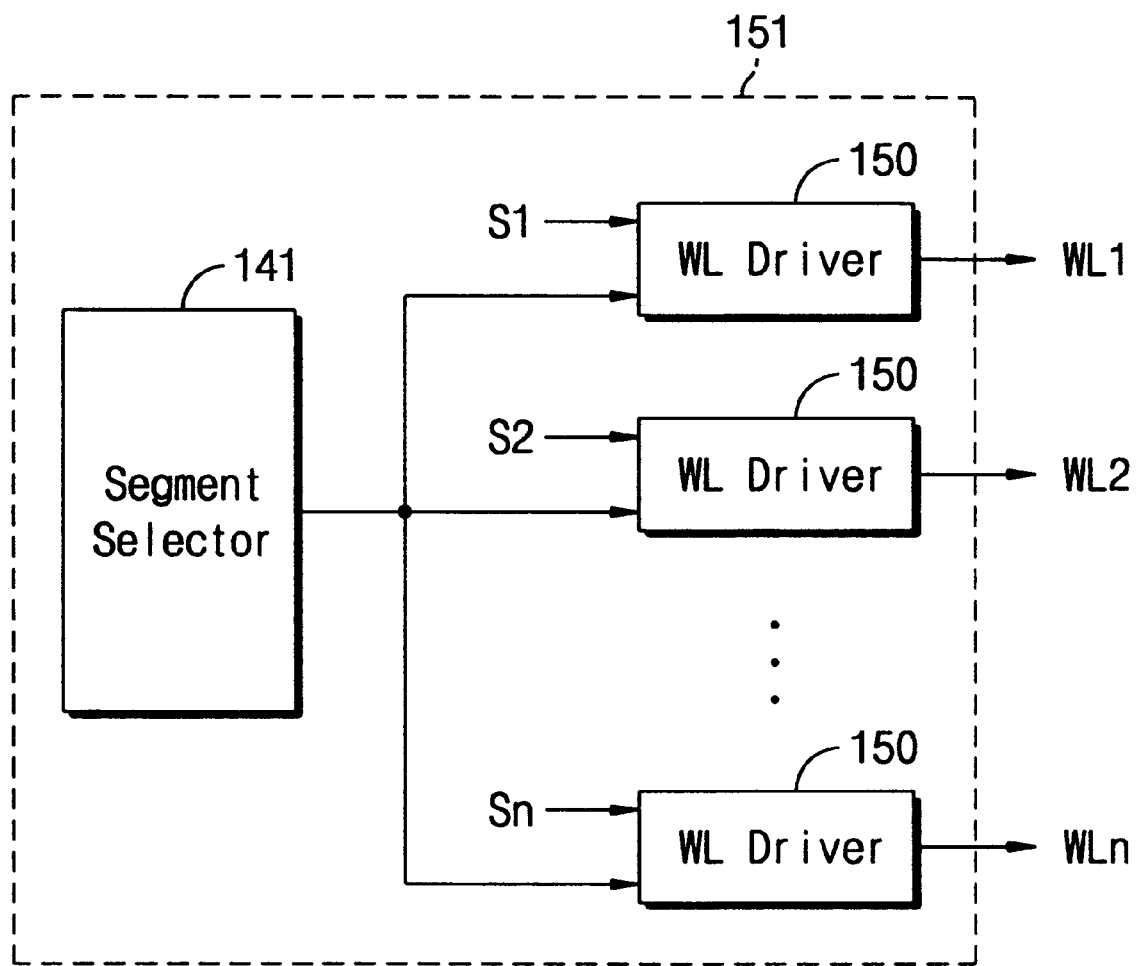
FIG. 2 is a block diagram of the segment decoder in FIG. 1 according to the prior art.
Figure 3:
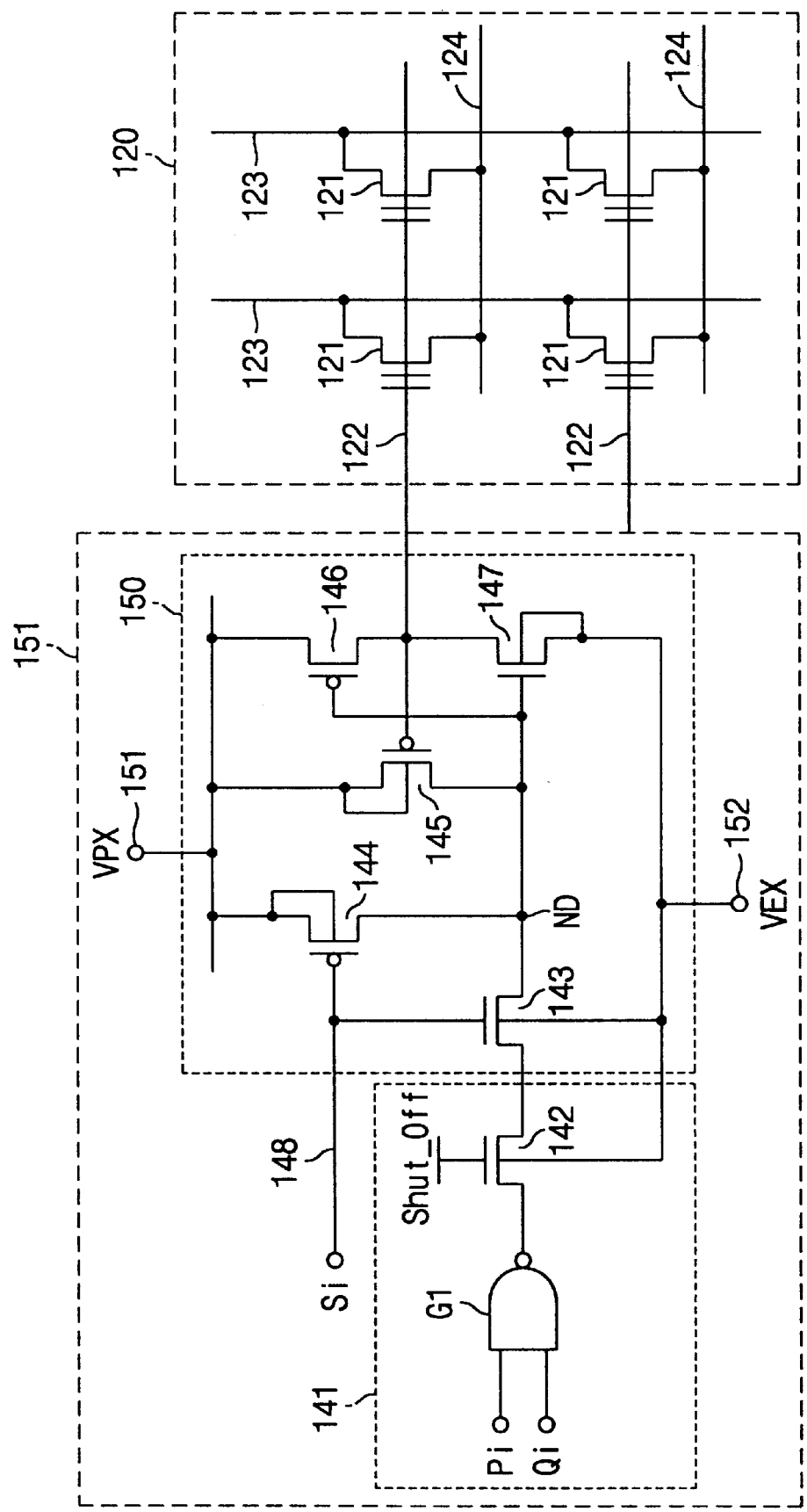
FIG. 3 shows a part of memory cell array in FIG. 1 and a circuit diagram of a segment selector 141 and a word line driver 150 according to the prior art.
Figure 4:
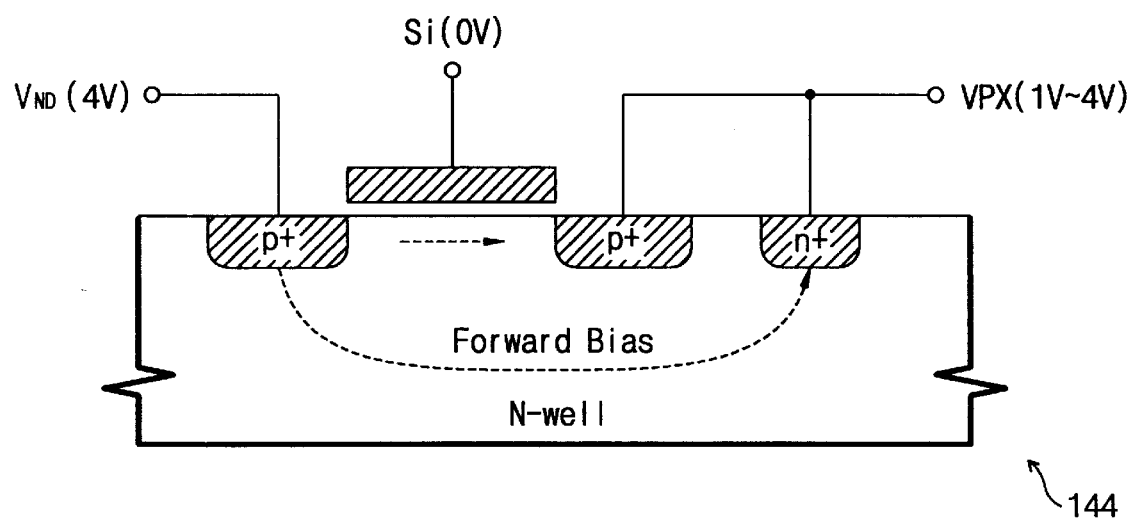
FIG. 4 is a cross section diagram of PMOS transistor 144 of FIG. 3.

It should be understood that the description of the preferred embodiments is merely illustrative and that it should not be taken in a limiting sense. In the following detailed description, several specific details are set forth in order to provide a thorough understanding of the present invention. It will be readily apparent, however, to one skilled in the art that the present invention may be practiced without following exactly these specific details. Well known circuits are shown in diagrammatic or block diagram form in order not to obscure the present invention. In these figures, like parts are designated by like reference numerals with respect to FIGS. 1 to 3 relating to the prior art and for the sake of simplicity, no repetitive explanation is made on these parts.

Figure 1:
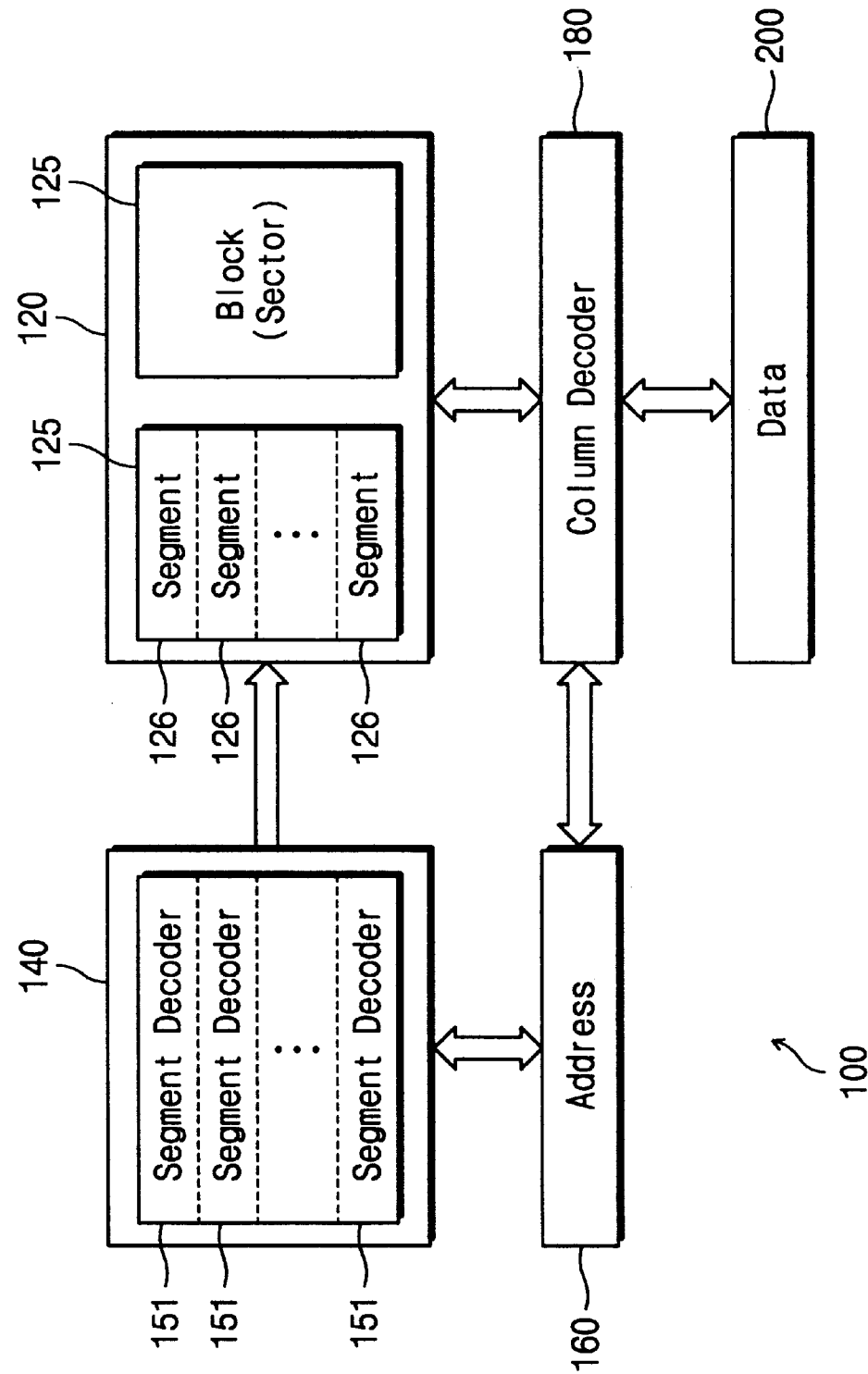
FIG. 1 is a block diagram showing a conventional flash semiconductor memory device.
Figure 5:
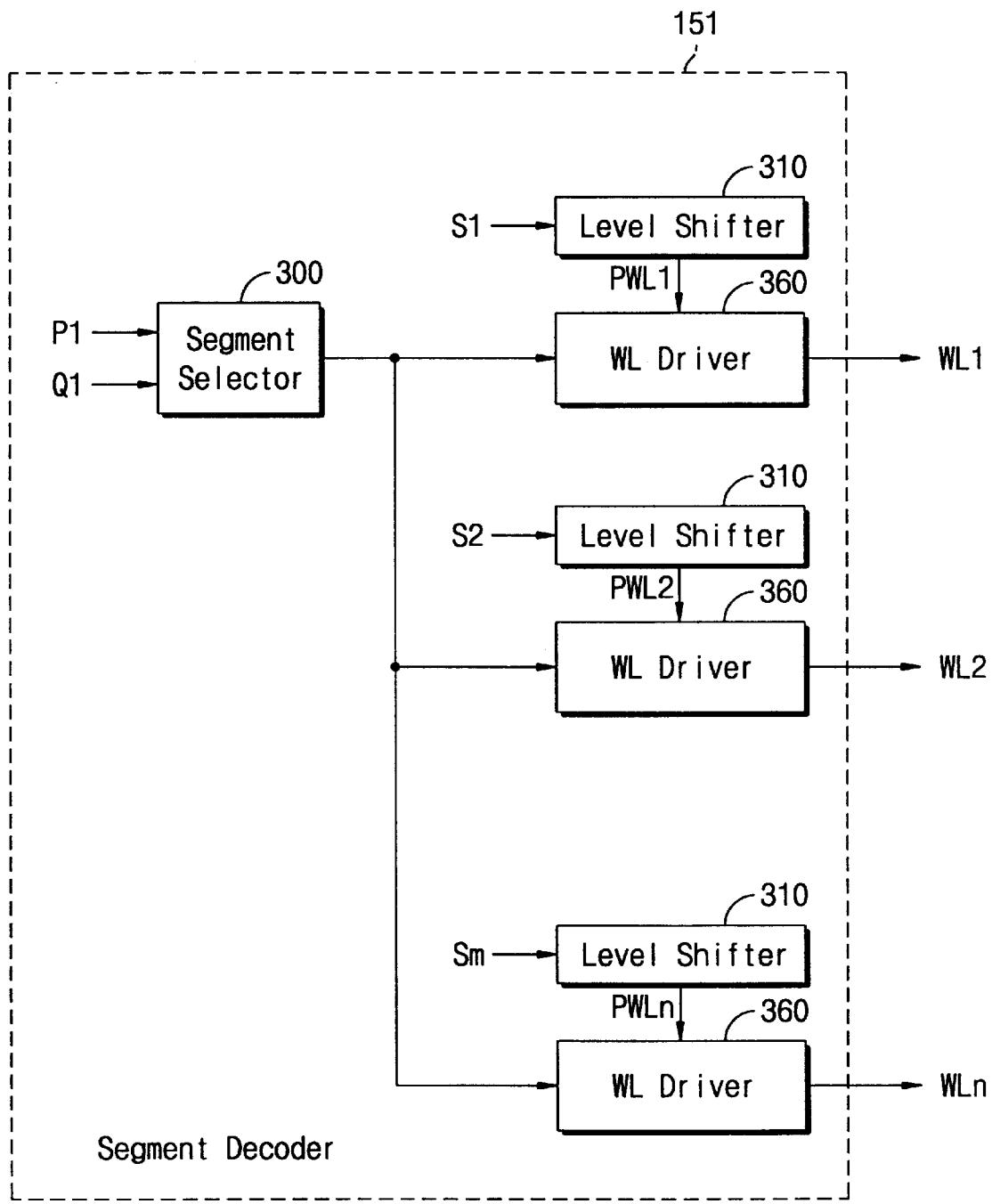
FIG. 5 is a block diagram showing one of the segment decoders in a row decoder circuit according to the present invention.

FIG. 5 is a block diagram showing one of the segment decoders 151 in the row decoder as circuit 140 in FIG. 1 according to the present invention. The segment decoder 151 in FIG. 5 corresponds to a first one of segments of a selected sector 125 in FIG. 1. As illustrated in FIG. 5, the segment decoder 151 comprises a segment selector 300 receiving corresponding segment select signals P1 an Q1, a plurality of word line drivers 360 each connected to word lines WL1 to WLn in the segment 126, and a plurality of level shifter circuits 310 connected to the corresponding word line drivers 360 and receiving word line select signals S1 to Sn. One (for example, S1) of the word line select signals S1 to Sn corresponding to a word line (for example, WL1) to be selected is enabled, and other signals (for example, S2 to Sn) are inactivated. The enabled level shifter circuit 310 provides to corresponding word line driver 360 a voltage PWLn required during the read, write, and test modes of operation. The operation of the segment decoder 151 will be described below.

Figure 6:
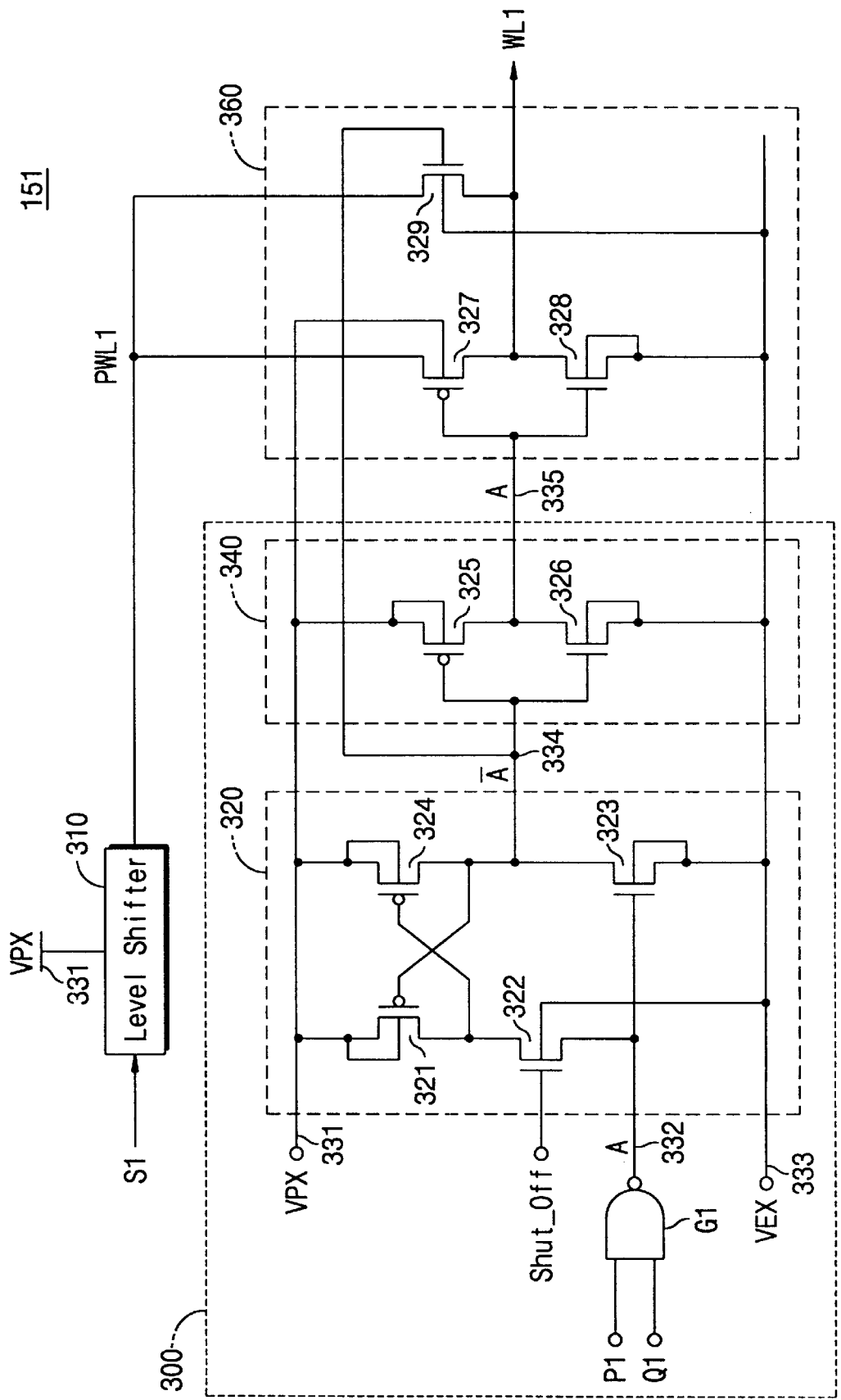
FIG. 6 is a diagram showing a segment decoder circuit according to a preferred embodiment of the present invention.

Referring to FIG. 6, there is illustrated a more detailed segment decoder circuit 151, which will be discussed in connection with one word line in an arbitrary segment 126 in FIG. 1, and it is to be understood that like circuits are coupled to other word lines in the segment 126. The segment decoder circuit 151 in FIG. 6 comprises a segment selector 300, a first level shifter circuit 310, and a word line driver 360. The segment selector 300 comprises a NAND gate G1, a second level shifter circuit 320, and an inverter circuit 340. The NAND gate G1 decodes corresponding segment select signals P1 and Q1. As above-mentioned, an output A of the NAND gate G1 corresponding to a selected segment 126 is at the low level, and others corresponding to unselected segment 126 are at the high level.

The level shifter circuit 320 in the segment selector 300 comprises two PMOS transistors 321 and 324 and two NMOS transistors 322 and 323, and is a shift-up type. The PMOS transistor 321 whose source is connected to a first power node 331 has its drain connected to the output terminal 332 of the NAND gate G1 through the NMOS transistor 322. The NMOS transistor 322 has its gate receiving a voltage Shut-Off, and acts as means for shutting off a high voltage transferred to the output terminal 332 of the NAND gate G1. The PMOS transistor 324 whose source is connected to the first power node 331 has its gate connected to a drain of the NMOS transistor 322 and its drain connected to a second power node 333 through the NMOS transistor 323 switched on/off in accordance with the output A of the NAND gate G1. The bulks of the transistors 322 and 323 are commonly tied to the second power node 333. The Shut-Off voltage becomes the power supply voltage Vcc during the read, write, and test modes of operation and becomes the ground voltage during the erase mode of operation, respectively.

The inverter circuit 340 includes a PMOS transistor 325 and an NMOS transistor 326. The circuit 340 is connected to an output terminal 334 of the second level shifter circuit 320. The gate of transistor 325 is connected to the output terminal 334 and its source is connected to the first power node 331 and its drain is coupled to the second power node 333 through the NMOS transistor 326. The NMOS transistor 326 has its gate connected to the output terminal 334 of the second level shifter circuit 320.

As illustrated in FIG. 6, the first level shifter circuit 310 receives a first voltage VPX supplied to the first power node 331 as an operating voltage and a corresponding word line select signal S1 corresponding to a word line (for example, WL1) to be selected as word line selection information. The first level shifter circuit 310 is a shift-up type. When the word line select signal S1 is at the low level indicating that the word line WL1 is not selected, an output PWL1 of the first level shifter circuit 310 becomes a low level (for example, 0 V). On the contrary, when the word line select signal S1 is at a high level indicating that the word line is selected, the output PWL1 of the first level shifter circuit 310 becomes the first voltage VPX.

Between the segment selector 300 and the corresponding word line WL1, there is the word line driver 360 which receives the output PWL1 of the first level shifter circuit 310 as an operating voltage and an output A of the inverter circuit 340 as an input signal. The word line driver 360 is comprised of a PMOS transistor 327 and two NMOS transistors 328 and 329. The PMOS transistor 327 whose gate is connected to the output terminal 335 of the inverter circuit 340 has its source receiving the output PWL1 of the first level shifter circuit 310 and its drain connected to corresponding word line WL1. The gate of NMOS transistor 328 is coupled to the output terminal 335 of the inverter circuit 340 and has a current path formed between the corresponding word line WL1 and the second power node 333. The gate of NMOS transistor 329 is tied to the output terminal 334 of the second level shifter circuit 320 and has its drain receiving the output PWL1 and its source connected to the corresponding word line WL1. Bulks of the transistors 322 and 329 are tied to the second power node 333.

The operation of the row decoder circuit 140 according to the present invention will be explained with reference to FIGS. 5 and 6.

During the read mode of operation, an output A of the NAND gate G1 corresponding to a selected segment is at low level, the word line select signal Si corresponding to a word line to be selected is at high level, the voltages VPX, VEX, and Shut-Off are 4.5V, 0V, and Vcc, respectively. This makes the transistors 322 and 324 in the second level shifter circuit 320 be turned on and the transistor 323 be turned off, so that the output /A of the second level shifter circuit 320 becomes the high level of the first voltage VPX, that is, approximately 4.5V and the PMOS transistor 321 is non-conductive. Since the output /A of the second level shifter circuit 320 is at the high level of approximately 4.5 Volts, an NMOS transistor 326 of the inverter circuit 340, and then PMOS and NMOS transistors 327 and 329 of the word line driver 360 are conductive. At this time, the first level shifter circuit 310 responds to the word line select signal Si of the high level and provides its output PWL1 of the first voltage VPX to the word line driver 360. This causes the selected word line to be raised up to the output PWL1 level of about 4.5V through the transistors 327 and 329 being at the conductive state.

For the unselected segments 126, the outputs A of the respective NAND gates G1 corresponding to unselected segments 126 are at the high level, the word line select signals Si corresponding to unselected word lines associated with the selected segment 126 and unselected segments 126 are at the low level, and the voltages VPX, VEX, and Shut-Off having 4.5V, 0V, and Vcc, respectively, are commonly applied to the unselected segments 126. Under this condition, the transistors 323, 325, and 328 of the segment decoder circuit 151 will be conductive and the transistors 324, 326, 327, and 329 thereof will be non-conductive. This makes unselected word lines associated with the selected segment 126 and other unselected segments 126 become 0V through the corresponding transistor 328 being conductive.

During the write mode of operation, the output A of the NAND gate G1 corresponding to the selected segment is at the low level, the word line select signal Si corresponding to the selected word line is at the high level, the voltages VPX, VEX, and Shut-Off are 10V, 0V, and Vcc, respectively. The output A of the NAND gate G1 having the low level and the above voltage biases turn on transistors 322 and 324 and turn off transistor 323, and the output /A of the second level shifter circuit 320 becomes a high level, approaching the first voltage VPX, that is, about 10V. Transistor 321 is non-conductive. Since the output /A of the second level shifter circuit 320 is at a high level of about 10V, NMOS transistor 326 of the inverter circuit 340 and PMOS and NMOS transistors 327 and 329 of the word line driver 360 are turned on. The first level shifter circuit 310 responds to the word line select signal Si of high level and provides its output PWL1 of the first voltage VPX, that is, about 10 V, to the word line driver 360. This causes the selected word line to be raised up to the output PWL1 level of about 10 V through the transistors 327 and 329 being conductive.

For the unselected segments 126, the outputs A of the respective NAND gates G1 corresponding to unselected segments 126 are at a high level, the word line select signals Si corresponding to unselected word lines associated with the selected segment 126 and other unselected segments 126 are at a low level, and the voltages VPX, VEX, and Shut-Off having 10 Volts, 0 Volts, and Vcc, respectively, are commonly applied to the unselected segments. According to this bias condition, the transistors 323, 325, and 328 will be conductive, and the transistors 324, 326, 327, and 329 thereof will be non-conductive. This causes the unselected word lines to go to 0V through the conducting transistor 328.

During the erase mode of operation, as well known to those skilled in the art, all flash EEPROM cells of one sector (or block) 125 in FIG. 1 is simultaneously erased. Therefore, all the word lines of the sector 125 have to be selected at the same time. In order to perform the erase operation, outputs A of the NAND gates G1 corresponding to all the segments 126 within the sector 125 are at the low level, and the voltages VPX, VEX, Shut-Off have 0V, −10V, and 0V in that order. Note that word line select signals Si respectively corresponding to the word lines in each segment are at the low level instead of the high level. According to this bias condition, the transistors 323, 325, and 328 are conductive, causing all the word lines to be pull down at about −10V through the conducting NMOS transistor 328.

During the test mode of operation, the operation of the row decoder circuit 140 is the same as that of the read mode of operation except that the first voltage VPX is changed from the lowest voltage (for example, 1V indicating an over-erase verification level of the flash EEPROM cells) to the highest voltage (for example, 6V indicating a programming verification level of the flash EEPROM cells) instead of being maintained at a fixed voltage. For the sake of simplicity, no repetitive explanation is made. As a result, a threshold voltage distribution of a selected flash EEPROM cell is sequentially detected during the test mode of operation.

Advantageously, the illustrative circuit configuration of the row decoder circuit according to the present invention solves the problem in the prior art. The various voltages (for example, 1V through 10V) are made available and useful in the read, write, erase, and test modes of operation. Second, the number of components of the word line driver 150 (a repeated circuit pattern) respectively connected to each of the word lines in FIG. 2 occupy more chip area than the illustrative word line driver according to the present invention. As a result, the illustrative row decoder circuit according to the present invention occupies less chip area that of the prior art configuration. For example, the occupied chip area by the components of the row decoder circuit in FIG. 6 will be reduced by approximately 40% as compared to the prior art.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An erasable programmable nonvolatile semiconductor memory device comprising:

a memory cell array having a plurality of memory blocks each divided into a plurality of segments, wherein each of the segments has a plurality of word lines, a plurality of bit lines arranged to intersect the word lines, and a plurality of memory cells connected to the word lines and the bit lines;

means for decoding segment select signals to generate a decode signal that selects one of the segments, said means for decoding being connected to a first power node and a second power node;

a plurality of level shifters, each connected to the first power node, said plurality of level shifters for receiving word line select signals, said word line select signals for selecting one of the word lines in the selected segment, said plurality of level shifters for outputting a first voltage upon said selection of said one of the word lines; and means connected to the first power node and a second power node, for applying the first voltage to a word line driver of the selected word line during read, write, and test modes of operation, and for applying a second voltage supplied from the second power node to the word line driver of the selected word line during an erase mode of operation, in response to the decoded signal from the means for decoding.

2. The device according to claim 1, wherein said means for decoding comprises:
- a logic circuit for decoding the segment select signals;
- a first inverting circuit for inverting a voltage level of a signal decoded by the logic circuit either into the first voltage or into the second voltage; and
- a second inverting circuit connected to the first power node and the second power node, for inverting the signal inverted by the first inverting circuit to output the signal as the decoded signal.

3. The device according to claim 2, wherein said first inverting circuit comprises:
- a first PMOS transistor having a source connected to the first power node, a gate and a drain;
- a second PMOS transistor having a source connected to the first power node, a gate connected to the drain of the first PMOS transistor, and a drain connected to both an input of the second inverting circuit and the gate of the first PMOS transistor;
- a first NMOS transistor having a drain connected to the gate of second PMOS transistor, a source connected to an output of the logic circuit, and a gate for receiving a third voltage, wherein a bulk of the first NMOS transistor is coupled to the second power node; and
- a second NMOS transistor having a gate connected to the output of the logic circuit, a drain connected to the input of the second inverting circuit, and a source connected to the second power node.

4. The device according to claim 3, wherein said third voltage is a power supply voltage during the read, write, and test modes of operation, and is 0V during the erase mode of operation.

5. The device according to claim 2, wherein said second inverting circuit comprises a CMOS inverter having a PMOS transistor and an NMOS transistor connected in series between the first and second power nodes.

6. The device according to claim 2, wherein said first inverting circuit includes means for voltage-shifting-up said signal decoded by the logic circuit.

7. The device according to claim 1, wherein said means for applying comprises:
- a pull-up PMOS transistor having a source for receiving the first voltage, a gate connected to the output of the second inverting circuit, and a drain connected to the selected word line; and
- a pull-down NMOS transistor having a drain connected to the selected word line, a source connected to the second power node, and a gate connected to the output of the second inverting circuit.

8. The device according to claim 7, wherein a bulk of the pull-up PMOS transistor is connected to the first power node.

9. The device according to claim 7, further comprising a second NMOS transistor having a gate connected to the output of the first inverting circuit, a drain for receiving the first voltage, and a source connected to the selected word line, wherein a bulk of the second NMOS transistor is connected to the second power node.

10. An erasable programmable nonvolatile semiconductor memory device comprising:
- a memory cell array having a plurality of memory blocks each divided into a plurality of segments, wherein each of the segments has a plurality of word lines, a plurality of bit lines arranged to intersect the word lines, and a plurality of memory cells connected to the word lines and the bit lines, said memory cell array being connected to first and second power nodes;
- a decoder for decoding segment select signals to generate a decode signal that selects one of the segments;
- a voltage translator for translating the decode signal to a higher voltage level;
- a level shifter, connected to said first power node, for receiving word line select signals, the level shifter for outputting a third voltage upon selection of a word line by said word line select signals; and
- a word line driver for applying the third voltage to a selected word line during read, write, and test modes of operation, and for applying a second voltage supplied by the second power node to the selected word line during an erase mode of operation, in response to the decoded signal.

11. The device according to claim 10, wherein said decoder includes a logic circuit for decoding the segment select signals, and said voltage translator is connected to the first power node and the second power node to output the decode signal at either a first voltage or the second voltage.

12. The device according to claim 11, wherein said voltage translator circuit comprises:
- a first PMOS transistor having a source connected to the first power node, a gate and a drain;
- a second PMOS transistor having source connected to the first power node, a gate connected to the drain of the first PMOS transistor, and a drain connected to both an output of the voltage translator circuit and the gate of the first PMOS transistor;
- a first NMOS transistor having a drain connected to the gate of second PMOS transistor, a source connected to an output of the logic circuit, and a gate for receiving a third voltage; and
- a second NMOS transistor having a gate connected to the output of the logic circuit, a drain connected to the output of the voltage translator circuit, and a source connected to the second power node.

13. The device according to claim 12, wherein a bulk of the first NMOS transistor is coupled to the second power node.

14. The device according to claim 13, wherein said third voltage is a power supply voltage during the read, write, and test modes of operation, and is 0V during the erase mode of operation.

15. The device according to claim 12, further comprising an inverting circuit comprises a CMOS inverter having a PMOS transistor and an NMOS transistor connected in series between the first and second power nodes.

16. The device according to claim 15, wherein said word line driver comprises:
- a pull-up PMOS transistor having a source for receiving the third voltage from the level shifter, a gate connected to the output of the inverting circuit, and a drain connected to the selected word line; and
- a pull-down NMOS transistor having a drain connected to the selected word line, a source connected to the second power node, and a gate connected to the output of the inverting circuit.

17. The device according to claim 16, wherein a bulk of the pull-up PMOS transistor is connected to the first power node.

18. The device according to claim 16, wherein said word line driver further comprises a second NMOS transistor having a gate connected to an output of the voltage translator, a drain for receiving the first voltage, and a source connected to the selected word line, wherein a bulk of the second NMOS transistor is connected to the second power node.

19. The device according to claim 1, wherein during said test mode, said means for applying includes means for outputting a varying voltage at the selected word line corresponding to a varying voltage at said first power node.

20. The device according to claim 10, further including means for varying the third voltage and outputting a varying voltage corresponding to said third voltage at the selected word line.

* * * * *